US011367633B2

(12) United States Patent
Yamaguchi

(10) Patent No.: US 11,367,633 B2
(45) Date of Patent: Jun. 21, 2022

(54) HEAT TREATMENT APPARATUS AND HEAT TREATMENT METHOD

(71) Applicant: Tokyo Electron Limited, Tokyo (JP)

(72) Inventor: Tatsuya Yamaguchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 146 days.

(21) Appl. No.: 16/515,144

(22) Filed: Jul. 18, 2019

(65) Prior Publication Data

US 2020/0026314 A1 Jan. 23, 2020

(30) Foreign Application Priority Data

Jul. 20, 2018 (JP) .............................. JP2018-137086

(51) Int. Cl.
*H01L 21/67* (2006.01)
*G05D 23/19* (2006.01)
(Continued)

(52) U.S. Cl.
CPC .... *H01L 21/67115* (2013.01); *C23C 16/4583* (2013.01); *C23C 16/4584* (2013.01);
(Continued)

(58) Field of Classification Search
CPC .......... G05D 23/1932; H01L 21/67115; H01L 21/67098; H01L 21/324; C23C 16/463;
(Continued)

(56) References Cited

U.S. PATENT DOCUMENTS 5,507,639 A * 4/1996 Monoe .................. C23C 16/481
432/123
5,616,264 A * 4/1997 Nishi ...................... C23C 16/46
219/483
(Continued)

FOREIGN PATENT DOCUMENTS

JP 07-099164 A 4/1995
JP 2007-221059 A 8/2007
(Continued)

*Primary Examiner* — Jeffrie R Lund
(74) *Attorney, Agent, or Firm* — Abelman, Frayne & Schwab

(57) ABSTRACT

A heat treatment apparatus includes: a vertically-extended processing container configured to accommodate a substrate; a gas supply including a gas supply pipe that extends along an inner wall surface of the processing container in a vertical direction; a heater having a heat insulating material provided around the processing container, and a heating element provided along the inner wall surface of the heat insulating material; and a cooler having a fluid flow path formed outside the heat insulating material, and a blowing-out hole penetrating the heat insulating material and configured to blow out a cooling fluid toward the gas supply pipe, the blowing-out hole having one end that communicates with the fluid flow path and a remaining end that communicates with a space between the processing container and the heat insulating material. A plurality of blowing-out holes is provided in the gas supply pipe in a longitudinal direction.

20 Claims, 6 Drawing Sheets

(51) Int. Cl.
   *F27D 21/00*     (2006.01)
   *C23C 16/46*     (2006.01)
   *C23C 16/458*    (2006.01)
   *C23C 16/455*    (2006.01)
   *F27D 19/00*     (2006.01)

(52) U.S. Cl.
   CPC ...... *C23C 16/45578* (2013.01); *C23C 16/463* (2013.01); *F27D 21/0014* (2013.01); *G05D 23/1932* (2013.01); *H01L 21/67098* (2013.01); *F27D 2019/0003* (2013.01)

(58) Field of Classification Search
   CPC .......... C23C 16/4583; C23C 16/45578; C23C 16/4584; F27D 21/0014; F27D 2019/0003
   See application file for complete search history.

(56) References Cited

U.S. PATENT DOCUMENTS

| | | | | |
|---|---|---|---|---|
| 8,033,823 B2* | 10/2011 | Nakao | C23C 16/54 | 432/238 |
| 8,336,487 B2* | 12/2012 | Ishida | H01L 21/022 | 118/696 |
| 11,043,402 B2* | 6/2021 | Kosugi | F27B 17/0025 | |
| 11,114,319 B2* | 9/2021 | Yamaguchi | H01L 21/2636 | |
| 2009/0111285 A1* | 4/2009 | Yamazaki | H01L 21/67109 | 438/795 |
| 2009/0136888 A1* | 5/2009 | Nakao | C23C 16/4411 | 432/152 |
| 2010/0224614 A1* | 9/2010 | Kobayashi | H01L 21/425 | 219/385 |
| 2012/0006506 A1* | 1/2012 | Murata | H01L 21/67109 | 165/59 |
| 2012/0064472 A1* | 3/2012 | Yoshii | F27B 17/0025 | 432/42 |
| 2012/0325804 A1* | 12/2012 | Kobayashi | H01L 21/67109 | 219/531 |
| 2013/0065189 A1* | 3/2013 | Yoshii | C23C 16/481 | 432/9 |
| 2014/0182515 A1* | 7/2014 | Yamazaki | C23C 16/45578 | 118/722 |
| 2014/0213069 A1* | 7/2014 | Takebayashi | H01L 21/02189 | 438/770 |
| 2014/0256160 A1* | 9/2014 | Wada | H01L 21/0262 | 438/786 |
| 2014/0287375 A1* | 9/2014 | Kosugi | F27B 17/0025 | 432/233 |
| 2015/0140835 A1* | 5/2015 | Tateno | C23C 16/52 | 438/773 |
| 2015/0221532 A1* | 8/2015 | Kosugi | H01L 21/67109 | 219/531 |
| 2015/0262817 A1* | 9/2015 | Okuno | C23C 16/46 | 438/787 |
| 2015/0370245 A1* | 12/2015 | Sugishita | H01L 21/67248 | 700/121 |
| 2016/0027661 A1* | 1/2016 | Sato | H05B 3/0047 | 438/795 |
| 2016/0376701 A1* | 12/2016 | Takewaki | C23C 16/466 | 118/724 |
| 2017/0073811 A1* | 3/2017 | Kikuchi | C23C 16/45578 | |
| 2017/0114464 A1* | 4/2017 | Iriuda | H01L 21/67309 | |
| 2017/0218507 A1* | 8/2017 | Kim | H05B 3/46 | |
| 2018/0197759 A1* | 7/2018 | Yamaguchi | H01L 21/67109 | |
| 2018/0264516 A1* | 9/2018 | Fujikawa | C23C 16/45578 | |
| 2018/0274098 A1* | 9/2018 | Takagi | C23C 16/52 | |
| 2018/0286662 A1* | 10/2018 | Nagatomi | C23C 16/405 | |
| 2020/0026314 A1* | 1/2020 | Yamaguchi | G05D 23/1932 | |
| 2020/0340116 A1* | 10/2020 | Kikuchi | C23C 16/45578 | |
| 2020/0392619 A1* | 12/2020 | Jung | C23C 16/4412 | |
| 2021/0104421 A1* | 4/2021 | Oikawa | H01L 21/67103 | |
| 2021/0181033 A1* | 6/2021 | Akao | H01L 21/67248 | |

FOREIGN PATENT DOCUMENTS

| | | |
|---|---|---|
| JP | 2010-226092 A | 10/2010 |
| JP | 2013-062361 A | 4/2013 |
| JP | 2014-209569 A | 11/2014 |
| KR | 10-2009-0014686 A | 2/2009 |
| KR | 10-2010-0098337 A | 9/2010 |
| KR | 10-2013-0029009 A | 3/2013 |
| KR | 10-2016-0095698 A | 8/2016 |
| TW | I405266 B | 8/2013 |
| TW | I603400 B | 10/2017 |

* cited by examiner

HEAT TREATMENT APPARATUS AND HEAT TREATMENT METHOD

CROSS-REFERENCE TO RELATED APPLICATION

This application is based on and claims priority from Japanese Patent Application No. 2018-137086, filed on Jul. 20, 2018 with the Japan Patent Office, the disclosure of which is incorporated herein in its entirety by reference.

TECHNICAL FIELD

The present disclosure relates to a heat treatment apparatus and a heat treatment method.

BACKGROUND

There is known a batch-type vertical heat treatment apparatus which collectively performs a heat treatment on a large number of substrates at once. In the vertical heat treatment apparatus, for example, a gas supply pipe is provided in the longitudinal direction of a vertically-extended processing container that accommodates substrates, and gas is emitted in a horizontal direction from a plurality of gas holes formed at predetermined intervals in the longitudinal direction of the gas supply pipe. In addition, in the vertical heat treatment apparatus, a heater device is provided to surround the processing container, and the substrates and the gas supply pipe are heated by the heater device.

There is also known a vertical heat treatment apparatus including a cooler configured to blow out a cooling fluid such as, for example, air into the space between the processing container and the heater device (see, e.g., Japanese Patent Laid-open Publication Nos. 07-099164 and 2007-221059).

SUMMARY

A heat treatment according to an aspect of the present disclosure includes: a vertically-extended processing container configured to accommodate a substrate; a gas supply including a gas supply pipe that extends along an inner wall surface of the processing container in a vertical direction; a heater having a heat insulating material provided around the processing container, and a heating element provided along the inner wall surface of the heat insulating material; and a cooler having a fluid flow path formed outside the heat insulating material, and a blowing-out hole penetrating the heat insulating material and blow out a cooling fluid toward the gas supply pipe, the blowing-out hole having one end that communicates with the fluid flow path and a remaining end that communicates with a space between the processing container and the heat insulating material, and the blowing-out hole being, wherein a plurality of blowing-out holes is provided in the gas supply pipe in a longitudinal direction.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
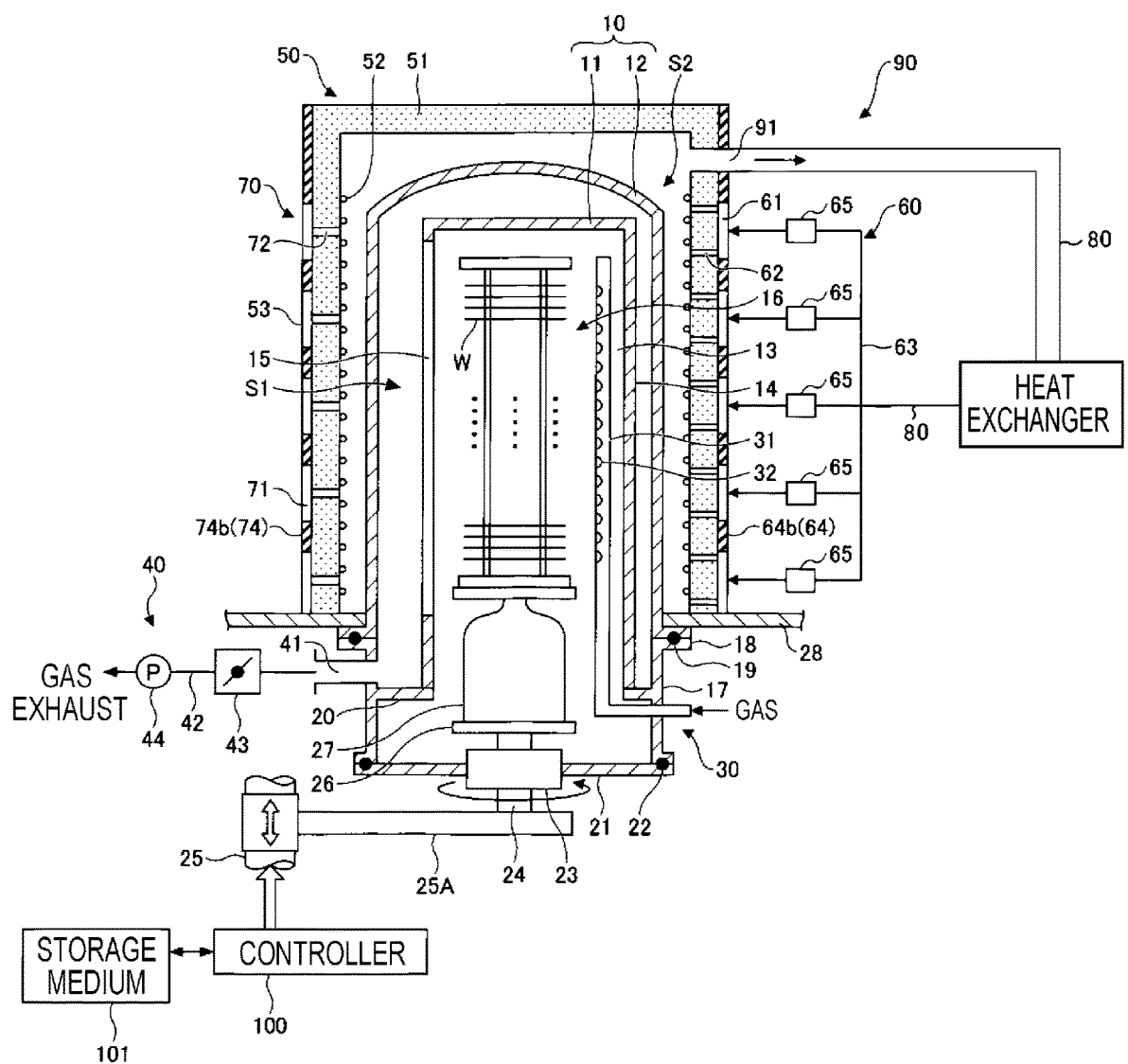
FIG. 1 is a schematic view illustrating an exemplary configuration of a heat treatment apparatus according to a first embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In all the accompanying drawings, the same or corresponding members or components will be denoted by the same or corresponding reference numerals, and redundant descriptions will be omitted.

First Embodiment (Heat Treatment Apparatus)

Figure 2A:
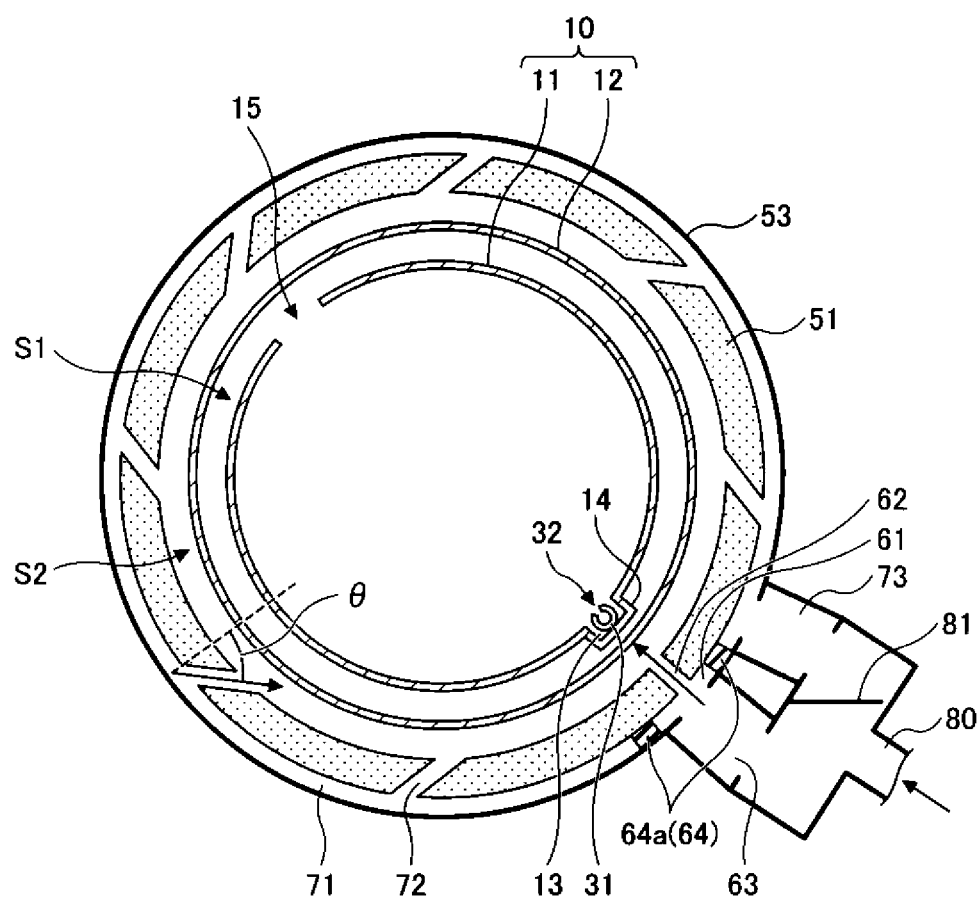
FIG. 2A is an explanatory view illustrating a first cooler and a second cooler of the heat treatment apparatus of FIG. 1. Moreover.
Figure 3:
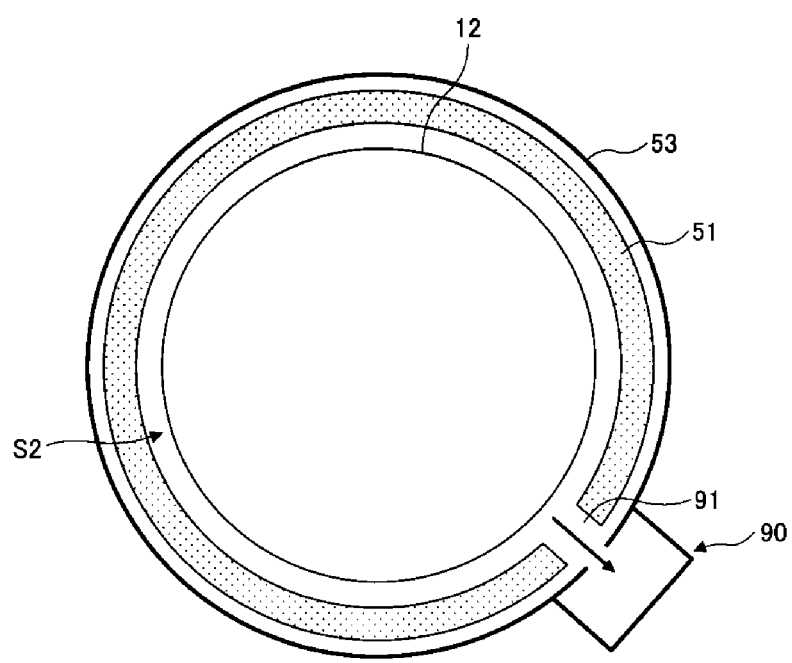
FIG. 3 is an explanatory view a heat exhauster of the heat treatment apparatus of FIG. 1.

An example of a heat treatment apparatus of a first embodiment will be described. FIG. 1 is a schematic view illustrating an exemplary configuration of the heat treatment apparatus according to the first embodiment. FIG. 2A is an explanatory view illustrating a first cooler and a second cooler of the heat treatment apparatus of FIG. 1. FIG. 3 is an explanatory view a heat exhauster of the heat treatment apparatus of FIG. 1.

As illustrated in FIGS. 1 to 3, the heat treatment apparatus includes, for example, a processing container 10, a gas supply 30, a gas exhauster 40, a heater 50, a first cooler 60, a second cooler 70, a fluid supply path 80, a heat exhauster 90, and a controller 100.

The processing container 10 accommodates a semiconductor wafer (hereinafter referred to as "wafer W") which is a substrate. The processing container 10 has a ceilinged cylindrical inner tube 11 having a lower opened end, and a ceilinged cylindrical outer tube 12 having a lower opened end to cover the outside of the inner tube 11. The inner tube 11 and the outer tube 12 are formed of a heat-resistant material such as, for example, quartz, and are arranged coaxially to form a double-tube structure.

The ceiling portion of the inner tube 11 is formed, for example, flat. On one side of the inner tube 11, a nozzle accommodation unit 13 is provided in the longitudinal direction thereof (vertical direction) to accommodate a gas supply pipe. In an embodiment, as illustrated in FIG. 2A, a portion of the side wall of the inner tube 11 protrudes outward so as to form a convex portion 14, and the inside of the convex portion 14 is formed as an accommodation portion 13.

In addition, in the side wall of the inner tube 11 opposite to the accommodation portion 13, a rectangular opening 15 is provided in the longitudinal direction (vertical direction).

The opening 15 is a gas exhaust port formed to be able to exhaust the gas within the inner tube 11. The length of the opening 15 is equal to the length of a wafer boat 16 or extends in the vertical direction to be longer than the length of the wafer boat 16. That is, the upper end of the opening 15 extends to a height equal to or higher than the position corresponding to the upper end of the wafer boat 16, and the lower end of the opening 15 extends to a height equal to or lower than the position corresponding to the lower end of the wafer boat 16.

The lower end of the processing container 10 is supported by a cylindrical manifold 17 made of, for example, stainless steel. A flange portion 18 is formed at the upper end of the manifold 17, and the lower end portion of the outer tube 12 is installed on and supported by the flange portion 18. A seal member 19 such as, for example, an O-ring is interposed between the flange portion 18 and the lower end portion of the outer tube 12 so that the inside of the outer tube 12 is hermetically sealed.

A circular annular support 20 is provided on the inner wall of the upper portion of the manifold 17, and the lower end portion of the inner tube 11 is installed on and supported by the support 20. A lid 21 is hermetically attached to the opening at the lower end of the manifold 17 via a seal member 22 such as, for example, an O-ring so as to hermetically close the opening at the lower end of the processing container 10, that is, the opening of the manifold 17. The lid 21 is formed of, for example, stainless steel.

In the center of the lid 21, a rotary shaft 24 configured to rotatably support the wafer boat 16 is provided through a magnetic fluid seal 23. The lower portion of the rotary shaft 24 is rotatably supported by an arm 25A of a lifter 25 configured as a boat elevator.

A rotary plate 26 is provided at the upper end of the rotary shaft 24, and the wafer boat 16 that holds wafers W is mounted on the rotary plate 26 via a heat insulating base 27 made of quartz. Therefore, by moving the lifter 25 up and down, it is possible to vertically move the lid 21 and the wafer boat 16 as a unit, and to insert/remove the wafer boat 16 into/from the processing container 10. The wafer boat 16 is a substrate holder which is capable of being accommodated in the processing container 10 and holds a plurality of wafers W at predetermined intervals.

A gas supply 30 is provided in the manifold 17. The gas supply 30 introduces a predetermined gas such as, for example, a processing gas or a purge gas into the inner tube 11. The gas supply 30 has a gas supply pipe 31 made of quartz. The gas supply pipe 31 is provided within the inner tube 11 in the longitudinal direction, and the base end thereof is bent in an L shape and is supported in the state of penetrating the manifold 17. A plurality of gas holes 32 are formed in the gas supply pipe 31 at predetermined intervals in the longitudinal direction so as to eject a gas horizontally therefrom. The predetermined intervals are set to be equal to, for example, the intervals of the wafers W supported by the wafer boat 16. The positions in the height direction are set such that each of the gas holes 32 is positioned in the middle between vertically adjacent wafers W, so that the gas holes 32 are capable of efficiently supplying the gas to the spaces between the wafers W. As the types of gases, a film-forming gas, an etching gas, and a purge gas are used, and as necessary, it is possible to supply the gases through the gas supply pipe 31 while controlling the flow rates thereof. In addition, the gas supply 30 may have a plurality of gas supply pipes, for example, for each type of gas.

The gas exhauster 40 exhausts the gas which is exhausted from the inside of the inner pipe 11 through the opening 15 and exhausted from a gas outlet 41 through the space S1 between the inner pipe 11 and the outer pipe 12. The gas outlet 41 is formed in the side wall of the upper portion of the manifold 17 and above the support 20. An exhaust passage 42 is connected to the exhaust outlet 41. A pressure regulating valve 43 and a vacuum pump 44 are sequentially interposed in the exhaust passage 42 so as to evacuate the inside of the processing container 10.

The heater 50 is provided around the processing container 10. The heater 50 is provided, for example, on the base plate 28. The heater 50 heats the wafers W within the processing container 10. The heater 50 has, for example, a cylindrical heat insulating material 51. The heat insulating material 51 is formed mainly of silica and alumina. The heater 50 is not particularly limited as long as it can heat the wafers W within the processing container 10, but may be, for example, an infrared heater that emits infrared light to heat the processing container 10. A linear heating element 52 is provided on the inner periphery of the heat insulating material 51 in a spiral or meandering shape. The heating element 52 is configured to be capable of temperature control by being divided into a plurality of zones in the height direction thereof. The heating element 52 is held on the inner wall surface of the heat insulating material 51 via a holding member (not illustrated). However, a recess may be formed in the inner wall surface of the heat insulating material 51, and the heating element may be accommodated in the recess.

In order to maintain the shape of the heat insulating material 51 and reinforce the heat insulating material 51, the outer periphery of the heat insulating material 51 is covered with an envelope 53 made of a metal such as, for example, stainless steel. In addition, in order to suppress the heat influence to the exterior of the heater 50, the outer periphery of the envelope 53 is covered with a water-cooling jacket (not illustrated).

The first cooler 60 supplies a cooling fluid (e.g., air) toward the gas supply pipe 31 provided in the longitudinal direction of the processing container 10 so as to cool the gas in the gas supply pipe 31. The first cooler 60 is used, for example, when a gas is supplied from the gas supply pipe 31 so as to perform a heat treatment on the wafers W. The first cooler 60 has a first fluid flow path 61, a plurality of blowing-out holes 62, and a distribution flow path 63.

Figure 2B:
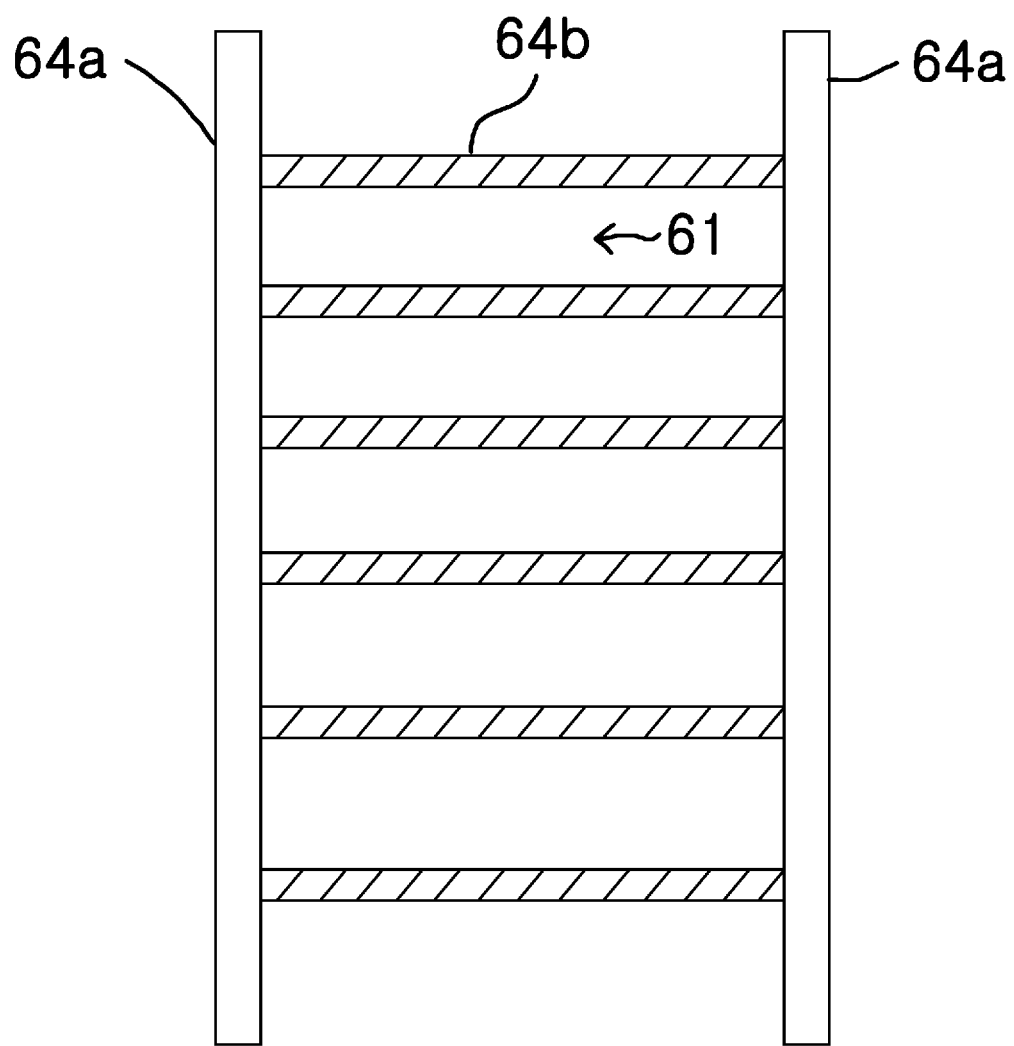
FIG. 2B is a detailed view illustrating a first fluid flow path and a heat insulating material of FIG. 2A.

A plurality of (for example, five) first fluid flow paths 61 are formed between the heat insulating material 51 and the envelope 53 in the height direction. The first fluid flow paths 61 are, for example, arc-shaped flow paths formed in an arc shape in the circumferential direction on the outside of the heat insulating material 51. The first fluid flow paths 61 are formed at positions corresponding to the positions at which the gas supply pipe 31 is provided in the circumferential direction of the processing container 10. The first fluid flow paths 61 are formed, for example, by bonding a heat insulating material 64 to the outer periphery of the heat insulating material 51. In an embodiment, as illustrated in FIGS. 1, 2A and 2B, the heat insulating material 64 includes two heat insulating materials 64a provided on the outer periphery of the heat insulating material 51 so as to extend from the lower end to the upper end thereof, and a plurality of heat insulating materials 64b disposed on the outer periphery of the insulating material with an interval therebetween in the height direction so as to connect the two heat insulating materials 64a thereto. A plurality of arc-shaped first fluid flow paths 61 are formed in the height direction on the outer periphery of the heat insulating material 51 by fitting the cylindrical envelope 53 outside the heat insulating material 51 via the heat insulating materials 64a and the heat insulating materials 64b.

The blowing-out holes 62 are formed through the heat insulating material 51 from respective first fluid flow paths 61, and blow out the cooling fluid in the horizontal direction toward the gas supply pipe 31. A plurality of (for example, two) blowing-out holes 62 are provided in the height direction within the range of each first fluid channel 61. However, one blowing-out hole 62 may be provided in the height direction within the range of each first fluid channel 61. The blowing-out holes 62 are formed, for example, by drilling the heat insulating material 51 from the inside or the outside using, for example, a drill, for example, before mounting the envelope 53. In addition, the blowing-out holes 62 may be formed by embedding blowing-out nozzles in the heat insulating material 51.

The distribution channel 63 is provided outside the envelope 53 and distributes and supplies the cooling fluid to each of the first fluid channels 61. The distribution channel 63 is provided with flow rate regulators 65 such as, for example, valves, for regulating the flow rate of the cooling fluid supplied to respective first fluid channels 61. This makes it possible to independently regulate the flow rate of the cooling fluid supplied to each first fluid channel 61. The flow rate regulators 65 are controlled based on, for example, the temperature of the gas in the gas supply pipe 31 detected by a temperature sensor (not illustrated). Since this makes it possible to perform a feedback control during execution of the heat treatment, it is possible to regulate the flow rate of the cooling fluid based on the temperature of the gas in real time. In addition, the distribution channel 63 may not be provided with the flow rate regulators 65. In this case, it is possible to regulate the flow rate of the cooling fluid blown out from each first fluid channel 61 by changing the diameter of the blowing-out hole 62 for each first fluid channel 61. For example, when it is desired to cool the upper side of the gas supply pipe 31 more than the lower side, the hole diameter of the blowing-out holes 62 located at the upper side in the plurality of first fluid channels 61 is increased, and the hole diameter of the blowing-out holes 62 located at the lower side is decreased.

The second cooler 70 supplies a cooling fluid (e.g., air) to the processing container 10 to cool the wafers W in the processing container 10. The second cooler 70 is used, for example, to rapidly cool the wafers W after the heat treatment. The second cooler 70 has a second fluid channel 71, a plurality of blowing-out holes 72, and a distribution channel 73.

A plurality of (for example, five) second fluid channels 71 are formed between the heat insulating material 51 and the envelope 53 in the height direction. The second fluid channels 71 are, for example, arc-shaped channels formed in an arc shape in the circumferential direction on the outside of the heat insulating material 51. The second fluid channels 71 are formed at positions different from those at which the gas supply pipe 61 is provided in the circumferential direction of the processing container 10. The second fluid channels 71 are formed, for example, by bonding a heat insulating material 74 to the outer periphery of the heat insulating material 51. In the example of FIGS. 1 and 2, the heat insulating material 74 includes a plurality of heat insulating materials 74b disposed on the outer periphery of the heat insulating material 51 with an interval therebetween in the height direction so as to connect the above-mentioned two heat insulating materials 64a thereto. A plurality of second fluid channels 71 are formed in the height direction on the outer periphery of the heat insulating material 51 by fitting the cylindrical envelope 53 outside the heat insulating material 51 via the heat insulating materials 64a and the heat insulating materials 74b.

The blowing-out holes 72 are formed through the heat insulating material 51 from respective second fluid channels 71. The blowing-out holes 72 are provided to be inclined by a predetermined angle θ (e.g., θ=35°) with respect to a direction oriented to the center of the heater 50 in a plan view in order to form flows of the cooling fluid that spiral along the circumferential direction of a space S2. The blowing-out holes 72 are formed, for example, by drilling the heat insulating material 51 from the inside or the outside using, for example, a drill, for example, before mounting the envelope 53. In addition, the blowing-out holes 72 may be formed by embedding blowing-out nozzles in the heat insulating material 51.

The distribution channel 73 is provided outside the envelope 53 and distributes and supplies the cooling fluid to each of the second fluid channels 71. The distribution channel 73 is provided with flow rate regulators (not illustrated) such as, for example, valves, for regulating the flow rate of the cooling fluid supplied to respective second fluid channels 71. This makes it possible to independently regulate the flow rate of the cooling fluid supplied to each second fluid channel 71. However, the distribution channel 73 may not be provided with the flow rate regulators.

In addition, the distribution channel 63 and the distribution channel 73 are connected to the fluid supply path 80. The fluid supply path 80 supplies the cooling fluid to the distribution channel 63 and the distribution channel 73. The fluid supply path 80 is provided with a channel switching unit 81 such as a valve for switching a connection destination to the distribution channel 63 or the distribution channel 73. The channel switching unit 81 switches the connection destination of the fluid supply path 80 to the first fluid channel 61, for example, during the heat treatment. This makes it possible to control the temperature of the gas in the gas supply pipe 31 during the heat treatment. In addition, the channel switching unit 81 switches the connection destination of the fluid supply path 80 to the second fluid channel 71 after the heat treatment. This makes it possible to rapidly cool the wafers W after the heat treatment.

The heat exhauster 90 has an exhaust port 91 provided above the plurality of blowing-out holes 62. The cooling fluid within the space S2 is discharged to the outside of the heat treatment apparatus through the exhaust port 91. The cooling fluid discharged to the outside of the heat treatment apparatus is cooled by a heat exchanger and is supplied to the fluid supply path 80 again. However, the cooling fluid discharged to the outside of the heat treatment apparatus may be discharged without being reused. The exhaust port 91 and the plurality of blowing-out holes 62 may be provided at positions which overlap with each other in a plan view. As a result, the flow of the cooling fluid blown out into the space S2 from the plurality of blowing-out holes 62 tends to rise in the longitudinal direction of the gas supply pipe 31. Therefore, it is possible to intensively cool the region where the gas supply pipe 31 is provided.

The controller controls the operation of the heat treatment apparatus. The controller 100 may be, for example, a computer. A computer program that performs the overall operation of the heat treatment apparatus 1 is stored in a storage medium 101. The storage medium 101 may be, for example, a flexible disk, a compact disk, a hard disk, a flash memory, or a DVD.

(Operation of Heat Treatment Apparatus)

An example of the operation (a heat treatment method) of the heat treatment apparatus of the first embodiment will be described. The heat treatment method is carried out by the controller 100 controlling the operation of each unit of the heat treatment apparatus.

First, the wafer boat 16 holding a large number of wafers W is carried (loaded) into the processing container 10 by the lifter 25, and the opening at the lower end of the processing container 10 is hermetically closed and sealed by the lid 21.

Subsequently, the gas exhauster 40 evacuates the processing container 10 such that the pressure within the processing container 10 becomes a predetermined degree of vacuum. Subsequently, a film forming gas is supplied into the processing container 10 by the gas supply 30, and the wafers W in the processing container 10 are heated by the heater 50. In addition, the cooling fluid is supplied from the plurality of blowing-out holes 62 toward the gas supply pipe 31 and the wafer boat 16 is rotated. Thus, a film is formed on each of the wafers W.

Subsequently, the supply of the film forming gas from the gas supply 30 is stopped. In addition, the heating of the wafers W by the heater 50 is stopped, the supply of the cooling fluid from the plurality of blowing out holes 62 is stopped, and the rotation of the wafer boat 16 is stopped.

Subsequently, the cooling fluid is blown out from the blowing-out holes 72 toward the processing container 10 to rapidly cool the wafers W within the processing container 10. Then, after the temperature of the wafers W within the processing container 10 becomes equal to or lower than a predetermined temperature, the lifter 25 carries out (unloads) the wafer boat 16 from the processing container 10.

As described above, in the first embodiment, a plurality of blowing-out holes 62 configured to blow the cooling fluid toward the gas supply pipe 31 vertically extending along the inner wall surface of the processing container 10 are provided in the gas supply pipe 31 in the longitudinal direction of the gas supply pipe 31. This makes it possible to regulate the flow rate of the cooling fluid blown out from the blowout holes 62 in the longitudinal direction of the gas supply pipe 31, and thus it is possible to control the temperature of the gas within the gas supply pipe 31 in the longitudinal direction of the processing container 10. As a result, it is possible to regulate the in-plane distribution of a film formed on each wafer W.

In addition, in the first embodiment, the first fluid channel 61 includes a plurality of arc-shaped channels formed in the vertical direction and flow rate regulators 65 each configured to regulate the flow rate of the cooling fluid flowing in each of the plurality of arc-shaped channels. This make it possible to control the temperature of the gas in the gas supply pipe 31 in the longitudinal direction of the processing container 10 depending on a heat treatment condition.

In addition, in the first embodiment, the heat exhauster 90 communicating with the space S2 above the plurality of blowing-out holes 62 and discharging the cooling fluid in the space S2 and the plurality of blowing-out holes 62 are provided at overlapping positions in a plan view. As a result, the flow of the cooling fluid blown out into the space S2 from the plurality of blowing-out holes 62 tends to rise in the longitudinal direction of the gas supply pipe 31. Therefore, it is possible to intensively cool the region where the gas supply pipe 31 is provided.

In addition, in the first embodiment, the cooling fluid recovered by the heat exhauster 90 is cooled by a heat exchanger and introduced again into the fluid supply path 80. This makes it possible to suppress the usage of the cooling fluid.

In the first embodiment, the second cooler 70 having the blowing-out holes 72 configured to blow out the cooling fluid toward the entire outer periphery of the processing container 10 is provided. This makes it possible to introduce the cooling fluid into the space S2 by the second cooler 70 and to forcedly cool the space S2 after the heat treatment, and thus it is possible to rapidly cool the wafers W after the heat treatment. Therefore, by supplying the cooling fluid to the space S2 after the heat treatment of one batch of wafers W is completed, it is possible to rapidly cool the processing container 10 and to shift the process to the heat treatment of the next batch, thereby improving the productivity.

In the first embodiment, the flow path switching unit 81 is provided to switch such that the connection destination of the fluid supply path 80, which communicates with the first fluid passage 61 and the second fluid passage 71, to the first fluid passage 61 or the second fluid passage 71. This makes it possible to control the temperature of the gas within the gas supply pipe 31 during the heat treatment, and to rapidly lower the temperature of the wafers W after the heat treatment.

In addition, in the first embodiment, the gas supply pipe 31 is accommodated in the accommodation portion 13 formed by protruding a portion of the side wall of the inner tube 11 to the outside. This makes it possible to effectively cool the gas supply pipe 31 while suppressing the cooling of the wafers W within the processing container 10 by the cooling fluid blown out from the blowing-out holes 62.

Second Embodiment

Figure 4:
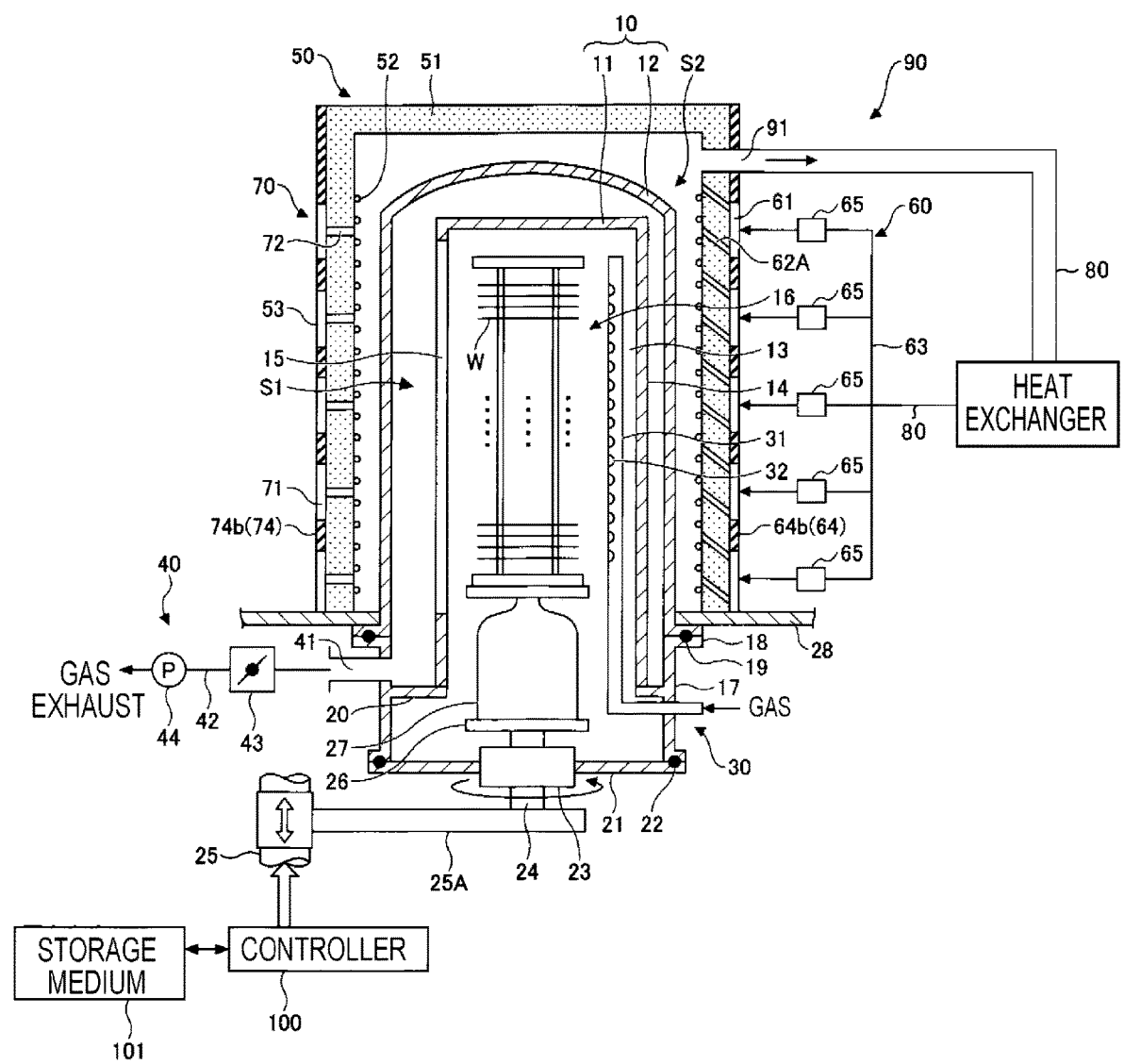
FIG. 4 is a schematic view illustrating an exemplary configuration of a heat treatment apparatus according to a second embodiment.

An example of a heat treatment apparatus of a second embodiment will be described. FIG. 4 is a schematic view illustrating an exemplary configuration of the heat treatment apparatus according to the second embodiment.

As illustrated in FIG. 4, the heat treatment apparatus according to the second embodiment includes a plurality of blowing-out holes 62A, each obliquely inclined upward from the first fluid flow path 61 side (one end side) toward the space S2 side (the other end side). The other configurations are the same as those of the first embodiment.

As described above, in the second embodiment, a plurality of blowing-out holes 62A configured to blow the cooling fluid toward the gas supply pipe 31 vertically extending along the inner wall surface of the processing container 10 are provided in the gas supply pipe 31 in the longitudinal direction of the gas supply pipe 31. This makes it possible to regulate the flow rate of the cooling fluid blown out from the blowout holes 62A in the longitudinal direction of the gas supply pipe 31, and thus it is possible to control the temperature of the gas within the gas supply pipe 31 in the longitudinal direction of the processing container 10.

In particular, in the second embodiment, the heat treatment apparatus includes a plurality of blowing-out holes 62A, each obliquely inclined upward from the first fluid flow path 61 side (one end side) toward the space S2 side (the other end side). Thus, a cooled region formed as the cooling fluid blown out from each blowing-out holes 62A collides with the outer pipe 12 has a vertically-long oval shape. Therefore, it is possible to intensively cool the region where the gas supply pipe 31 is provided.

Third Embodiment

Figure 5:
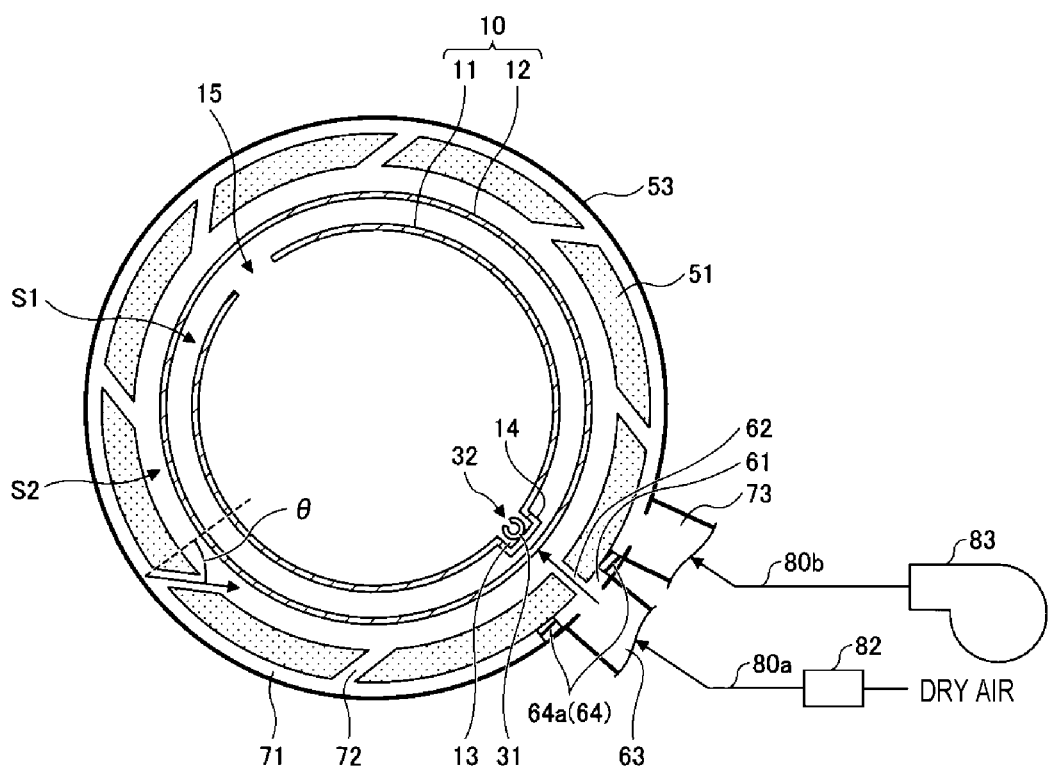
FIG. 5 is a schematic view illustrating an exemplary configuration of a heat treatment apparatus according to a third embodiment.

An example of a heat treatment apparatus of a third embodiment will be described. FIG. 5 is a schematic view illustrating an exemplary configuration of the heat treatment apparatus according to the third embodiment.

As illustrated in FIG. 5, in the heat treatment apparatus of the third embodiment, a fluid supply path configured to supply a cooling fluid to the first fluid flow paths 61 and the second fluid flow paths 71 is separately provided. That is, the heat treatment apparatus of the third embodiment includes a first fluid supply path 80*a* configured to supply the cooling fluid to the first fluid flow paths 61 and a second fluid supply path 80*b* configured to supply the cooling fluid to the second fluid flow paths 71.

The first fluid supply path 80*a* supplies the cooling fluid to the first fluid flow paths 61 via the distribution flow path 63. The first fluid supply path 80*a* is provided with a flow rate controller 82, and is supplied with dry air the flow rate of which is controlled by the flow rate controller 82.

The second fluid supply path 80*b* supplies the cooling fluid to the second fluid flow paths 71 via the distribution flow path 73. The second fluid supply path 80*b* is supplied with air by, for example, a blower 83.

As described above, in the third embodiment, a plurality of blowing-out holes 62 configured to blow the cooling fluid toward the gas supply pipe 31 vertically extending along the inner wall surface of the processing container 10 are provided in the gas supply pipe 31 in the longitudinal direction of the gas supply pipe 31. This makes it possible to regulate the flow rate of the cooling fluid blown out from the blowout holes 62 in the longitudinal direction of the gas supply pipe 31, and thus it is possible to control the temperature of the gas within the gas supply pipe 31 in the longitudinal direction of the processing container 10.

In particular, the heat treatment apparatus of the third embodiment includes a first fluid supply path 80*a* configured to supply the cooling fluid to the first fluid flow paths 61 and a second fluid supply path 80*b* configured to supply the cooling fluid to the second fluid flow paths 71. Thus, it is possible to individually set the type and flow rate of the cooling fluid supplied to the first fluid flow path 61 and the type and flow rate of the cooling fluid supplied to the second fluid flow path 71.

In the above-mentioned embodiments, the case where the processing container 10 has a double tube structure having the inner pipe 11 and the outer pipe 12 has been described. However, without being limited thereto, for example, the processing container 10 may have a single tube structure.

According to the present disclosure, it is possible to control the temperature of the gas in the gas supply pipe in the longitudinal direction of the processing container.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A heat treatment apparatus comprising:
   a vertically-extended processing container configured to accommodate a substrate;
   a gas supply including a gas supply pipe provided in the processing container along an inner wall surface of the processing container in a vertical direction and configured to supply a gas to the substrate;
   a heater including a heat insulator provided around the processing container, and a heating body provided along the inner wall surface of the heat insulator; and
   a cooler including a fluid flow path formed directly on an outer peripheral surface of the heat insulator in an arc shape, and a plurality of blowing-out holes each penetrating the heat insulator and configured to blow out a cooling fluid toward the gas supply pipe, each of the plurality of blowing-out holes having one end that communicates with the fluid flow path and a remaining end that communicates with a space between the processing container and the heat insulator,
   wherein the plurality of blowing-out holes are provided in the cooler along a longitudinal direction of the gas supply pipe.

2. The heat treatment apparatus according to claim 1, wherein a plurality of fluid flow paths including the fluid flow path are provided in the cooler in a vertical direction,
   the cooler includes a flow rate regulator configured to regulate a flow rate of the cooling fluid that flows in each of the plurality of fluid flow paths.

3. The heat treatment apparatus according to claim 2, wherein each of the plurality of blowing-out holes is inclined obliquely upward from a side of the one end to a side of the remaining end.

4. The heat treatment apparatus according to claim 3, further comprising:
   a heat dissipater that communicates with the space above the plurality of blowing-out holes and is configured to discharge the cooling fluid within the space.

5. The heat treatment apparatus according to claim 4, wherein the heat dissipater and the plurality of blowing-out holes are provided at positions that overlap with each other in a plan view.

6. The heat treatment apparatus according to claim 5, wherein the cooling fluid discharged by the heat dissipater through an exhaust port formed through the heat insulator is cooled by a heat exchanger and supplied to the fluid flow path again.

7. The heat treatment apparatus according to claim 6, further comprising:
   a rotary shaft configured to rotatably support a substrate holder that holds a substrate thereon within the processing container.

8. The heat treatment apparatus according to claim 7, further comprising:
   a second cooler including a second fluid flow path formed at a position different from a position of the fluid flow path outside the heat insulator, and a second blowing-out hole penetrating the heat insulator and configured to blow out the cooling fluid toward the processing container, the second blowing-out hole including one end that communicates with the second fluid flow path and a remaining end that communicates with the space between the processing container and the heat insulator;
   a fluid supply path that communicates with the fluid flow path and the second fluid flow path; and
   a flow path switch configured to switch a connection destination of the fluid supply path to the fluid flow path or the second fluid flow path.

9. The heat treatment apparatus according to claim 8, wherein the processing container includes a cylindrical inner tube having a ceiling and a lower opened end, and a cylindrical outer tube having a ceiling and a lower opened end and configured to cover an outside of the inner tube,
   the inner tube includes an accommodation portion formed by protruding a portion of a side wall thereof to the outside, and the gas supply pipe is accommodated in the accommodation portion.

10. The heat treatment apparatus according to claim 2, wherein the heat insulator includes:
a pair of first heat insulators provided on the outer peripheral surface of the heat insulator so as to extend from a lower end to an upper end of the heat insulator; and
a plurality of second heat insulators provided between the pair of first heat insulators on the outer peripheral surface of the heat insulator with a predetermined interval therebetween in the vertical direction such that the pair of first heat insulators are connected to each other by the plurality of second heat insulators,
the plurality of fluid flow paths are formed in the vertical direction by fitting a cylindrical envelope outside the heat insulator via the pair of first heat insulators and the plurality of second heat insulators such that each of the plurality of flow paths is formed between the heat insulator and the cylindrical envelope in the predetermined interval when viewed in a vertical cross section.

11. The heat treatment apparatus according to claim 1, wherein each of the plurality of blowing-out holes is inclined obliquely upward from a side of the one end to a side of the remaining end.

12. The heat treatment apparatus according to claim 1, further comprising:
a heat dissipater that communicates with the space above the plurality of blowing-out holes and configured to discharge the cooling fluid within the space.

13. The heat treatment apparatus according to claim 12, wherein the heat dissipater and the plurality of blowing-out holes are provided at positions that overlap with each other in a plan view.

14. The heat treatment apparatus according to claim 12, wherein the cooling fluid discharged by the heat dissipater through an exhaust port formed through the heat insulator is cooled by a heat exchanger and supplied to the fluid flow path again.

15. The heat treatment apparatus according to claim 1, further comprising:
a rotary shaft configured to rotatably support a substrate holder that holds a substrate thereon within the processing container.

16. The heat treatment apparatus according to claim 1, further comprising:
a second cooler including a second fluid flow path formed at a position different from a position of the fluid flow path outside the heat insulator, and a second blowing-out hole penetrating the heat insulator and configured to blow out the cooling fluid toward the processing container, the second blowing-out hole including one end that communicates with the second fluid flow path and a remaining end that communicates with the space between the processing container and the heat insulator;
a fluid supply path communicating with the fluid flow path and the second fluid flow path; and
a flow path switch configured to switch a connection destination of the fluid supply path to the fluid flow path or the second fluid flow path.

17. The heat treatment apparatus according to claim 1, wherein the processing container includes a cylindrical inner tube having a ceiling and a lower opened end, and a cylindrical outer tube having a ceiling and a lower opened end and configured to cover an outside of the inner tube, the inner tube includes an accommodation portion formed by protruding a portion of a side wall thereof to the outside, and
the gas supply pipe is accommodated in the accommodation portion.

18. A heat treatment method comprising:
providing a heat treatment apparatus comprising:
a vertically-extended processing container configured to accommodate a substrate;
a gas supply including a gas supply pipe provided in the processing container along an inner wall surface of the processing container in a vertical direction and configured to supply gas to the substrate;
a heater including a heat insulator provided around the processing container, and a heating body provided along the inner wall surface of the heat insulator; and
a cooler having a fluid flow path formed directly on an outer peripheral surface of the heat insulator in an arc shape, and a plurality of blowing-out holes each penetrating the heat insulator and configured to blow out a cooling fluid toward the gas supply pipe, each of the plurality of blowing-out holes having one end that communicates with the fluid flow path and a remaining end that communicates with a space between the processing container and the heat insulator,
wherein the plurality of blowing-out holes are provided in the cooler along a longitudinal direction of gas supply pipe,
accommodating the substrate in the vertically-extended processing container;
heating the processing container by the heating body;
supplying a gas from the gas supply; and
blowing out the cooling fluid toward the gas supply pipe through the plurality of blowing-out holes,
wherein the blowing out the cooling fluid toward the gas supply pipe is performed when the supplying the gas from the gas supply pipe is performed.

19. The heat treatment method according to claim 18, further comprising:
blowing out the cooling fluid toward the processing container through a plurality of second blowing-out holes penetrating the heat insulator from a second fluid flow path formed outside the heat insulator so as to communicate with the space between the processing container and the heat insulator,
wherein the blowing out the cooling fluid toward the processing container is performed when the supplying the gas from the gas supply pipe is not performed.

20. The heat treatment method according to claim 18, wherein the heat insulator includes:
a pair of first heat insulators provided on the outer peripheral surface of the heat insulator so as to extend from a lower end to an upper end of the heat insulator; and
a plurality of second heat insulators provided between the pair of first heat insulators on the outer peripheral surface of the heat insulator with a predetermined interval therebetween in the vertical direction such that the pair of first heat insulators are connected to each other by the plurality of second heat insulators,
a plurality of fluid flow paths including the fluid flow path are provided in the cooler in the vertical direction, and
the plurality of fluid flow paths are formed in the vertical direction by fitting a cylindrical envelope outside the heat insulator via the pair of first heat insulators and the plurality of second heat insulators such that each of the plurality of flow paths is formed between the heat insulator and the cylindrical envelope in the predetermined interval when viewed in a vertical cross section.

\* \* \* \* \*